United States Patent
Park

(10) Patent No.: US 7,952,120 B2
(45) Date of Patent: May 31, 2011

(54) SEMICONDUCTOR DEVICE

(75) Inventor: Jin Ho Park, Uijeongbu-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 257 days.

(21) Appl. No.: 12/244,142

(22) Filed: Oct. 2, 2008

(65) Prior Publication Data

US 2009/0159931 A1    Jun. 25, 2009

(30) Foreign Application Priority Data

Dec. 24, 2007 (KR) .................. 10-2007-0136553

(51) Int. Cl.
*H01L 23/528* (2006.01)
(52) U.S. Cl. .............. 257/211; 257/207; 257/E23.019
(58) Field of Classification Search .......... 257/207, 257/211, E23.019; 438/129
See application file for complete search history.

(56) References Cited

U.S. PATENT DOCUMENTS

| | | | |
|---|---|---|---|
| 7,348,640 B2 * | 3/2008 | Yamada | 257/390 |
| 7,411,822 B2 * | 8/2008 | Specht et al. | 365/185.05 |
| 7,476,945 B2 * | 1/2009 | Yamada | 257/401 |
| 7,605,409 B2 * | 10/2009 | Ahn et al. | 257/211 |
| 7,763,911 B2 * | 7/2010 | Zhang | 257/211 |
| 2002/0033489 A1 * | 3/2002 | Kobayashi | 257/202 |
| 2002/0053686 A1 * | 5/2002 | Suh | 257/211 |
| 2004/0238880 A1 * | 12/2004 | Nagasaka et al. | 257/316 |
| 2005/0184329 A1 * | 8/2005 | Prall | 257/314 |
| 2005/0274984 A1 * | 12/2005 | Hosotani et al. | 257/211 |
| 2006/0270212 A1 | 11/2006 | Jung et al. | |
| 2008/0067554 A1 * | 3/2008 | Jeong et al. | 257/211 |
| 2009/0166682 A1 * | 7/2009 | Scheuerlein | 257/211 |

FOREIGN PATENT DOCUMENTS

KR    10-2006-32656    9/2006

* cited by examiner

*Primary Examiner* — Allan R Wilson
(74) *Attorney, Agent, or Firm* — Saliwanchik, Lloyd & Eisenschenk

(57) ABSTRACT

Provided are embodiments of a semiconductor device having bit lines and bit bar lines. The bit lines and the bit bar lines are arranged in alternate succession across a substrate. At least two of proximate bit lines, bit line bars, power lines, and ground lines of the semiconductor device are formed on different layers, in order to reduce defects due to particles between lines, and increase yield.

4 Claims, 8 Drawing Sheets

SEMICONDUCTOR DEVICE

CROSS-REFERENCE TO RELATED APPLICATION

The present application claims the benefit under 35 U.S.C. §119 of Korean Patent Application No. 10-2007-0136553, filed Dec. 24, 2007, which is hereby incorporated by reference in its entirety.

BACKGROUND

Generally, it is very difficult to remove 100% of the sources of electrical shorts in wiring caused by particles generated in in-line processing, which directly effects yield from a wafer. When a unit cell of a memory device does not function properly due to the occurrence of a defect within a memory cell during processing, a semiconductor device repair structure is often utilized. Semiconductor device repair involves performing the functions of an inoperative unit cell by operating a pre-prepared circuit.

It is common practice to add a repair cell structure to a semiconductor device to ensure a certain yield.

FIG. 1 is a plan view of bit lines and bit bar lines of a semiconductor device according to the related art, and FIG. 2 is a cross-sectional view of the semiconductor device of FIG. 1 taken along line I-I'.

As shown in FIGS. 1 and 2, to drive transistors (not shown), a semiconductor device is provided with at least one bit line 10 and at least one bit bar line 20.

The bit lines 10 and the bit bar lines 20 are formed in repeating alternation.

The bit lines 10 and the bit bar lines 20 are connected to a substrate 1 through first contacts 11 and second contacts 21, respectively.

With continual decreases in pitch between bit lines formed on the same layer in accordance with advances in semiconductor device manufacturing technology, small particles that were not previously problematic are now a major cause for reducing yield.

BRIEF SUMMARY

Embodiments of semiconductor devices having bit lines and bit bar lines are provided. According to embodiments, the bit bar line can be the inverse signal of the bit line.

In one embodiment, a semiconductor device comprises: a first dielectric on a substrate; a first grouping of lines comprising bit lines on the first dielectric; a second dielectric on the first grouping of lines; and a second grouping of lines comprising bit bar lines on the second dielectric, where the bit lines are arranged in alternation with the bit bar lines.

In another embodiment, the first grouping of lines can include a bit line and bit bar line pair and the second grouping of lines can include a bit line and bit bar line pair. The first grouping and the second grouping can be arranged in alternation across the substrate.

In a further embodiment, a semiconductor device comprises: a first dielectric on a substrate; a first grouping of lines arranged on the first dielectric in a sequence of a first bit line, a first power line, a first bit bar line, and a second power line; a second dielectric on the first dielectric; and a second grouping of lines arranged on the second dielectric in alternation with the first groups and in a sequence of a second bit line, a third power line, a second bit bar line, and a fourth power line.

In a still further embodiment, a semiconductor device comprises: a first dielectric on a substrate, a second dielectric on the first dielectric; bit lines formed as electrically connected bit patterns alternatingly provided in the first dielectric and the second dielectric; and bit bar lines formed as electrically connected bit bar patterns alternatingly provided in the first and second dielectrics and in reverse to the bit patterns.

Thus, at least two of proximate bit lines, bit line bars, power lines, and ground lines of a semiconductor device can be formed on different layers, in order to reduce the occurrence of defects due to particles between lines, and to increase yield.

The details of one or more embodiments are set forth in the accompanying drawings and the description below. Other features will be apparent from the description and drawings, and from the claims.

DETAILED DESCRIPTION

Figure 1:
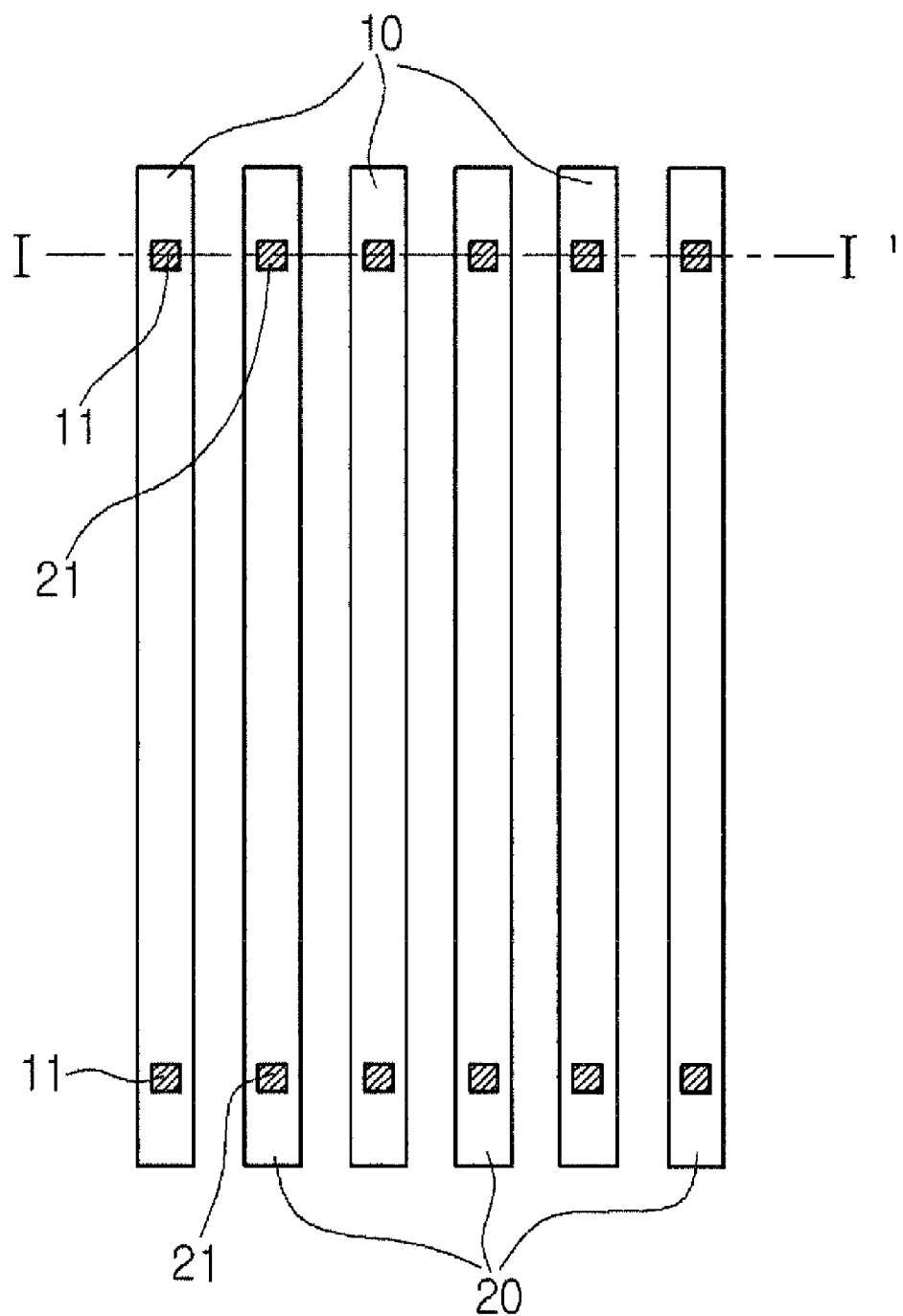
FIG. 1 is a plan view of a semiconductor device according to the related art.
Figure 2:
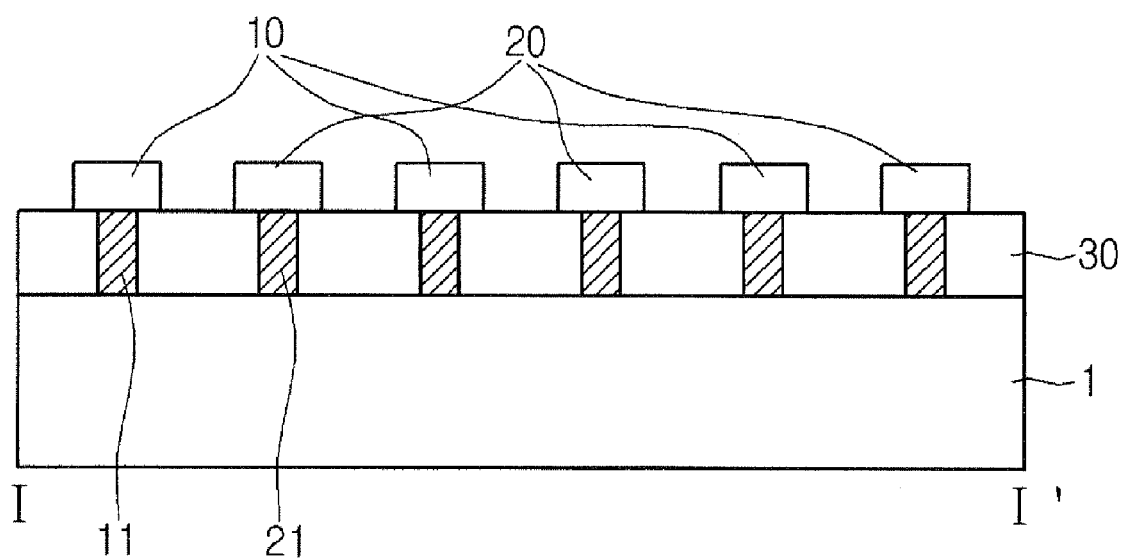
FIG. 2 is a cross-sectional view of the semiconductor device of FIG. 1 taken along line I-I'.

Reference will now be made in detail to embodiments of the present disclosure, examples of which are illustrated in the accompanying drawings.

It should be noted that the size (dimensions) of each element in the attached drawings are enlarged to aid in understanding the present disclosure, and the depicted dimensional ratios of the respective elements may be different from the actual dimensional ratios. Also, the present disclosure does not necessarily have to include all of the elements depicted in the drawings, and is not limited to those elements. In addition, elements other than those consistent with the central characteristics of the present disclosure may be added or deleted.

In descriptions of embodiments according to the present disclosure, when a layer (film), region, pattern, or structure is described as being formed "on/above/over/upper" or "down/below/under/lower" another substrate, layer (film), region, pad, or pattern, this denotes that the layer (film), region, pattern, or structure can be formed directly in contact on the other substrate, layer (film), region, pad, or pattern, or may denote that another layer (film), another region, another pad, another pattern, or another structure may be additionally formed therebetween. Thus, such denotations should be determined based on a technical understanding of the present invention.

Embodiments of the present invention relate to semiconductor devices having bit lines and bit bar lines. Certain embodiments can be applied to a variety of logic and memory devices. According to embodiments of the present invention, bit lines and bit bar lines are provided in mutual alternation using two line layers, where a first grouping of lines are provided in the first line layer and a second grouping of lines are provided using the second line layer above the first line layer. The first grouping can include bit lines only, bit bar lines only, or a combination of bit lines and bit bar lines; and the second grouping can include bit bar lines only, bit lines only, or a combination of bit lines and bit bar lines. In further embodiments, power lines (including ground lines) can be included in the first and second groupings. The groupings being on respectively different layers can provide sufficient gaps between selected lines while maintaining a high degree of integration. According to embodiments, the bit bar line can be the inverse signal of the bit line.

Figure 3:
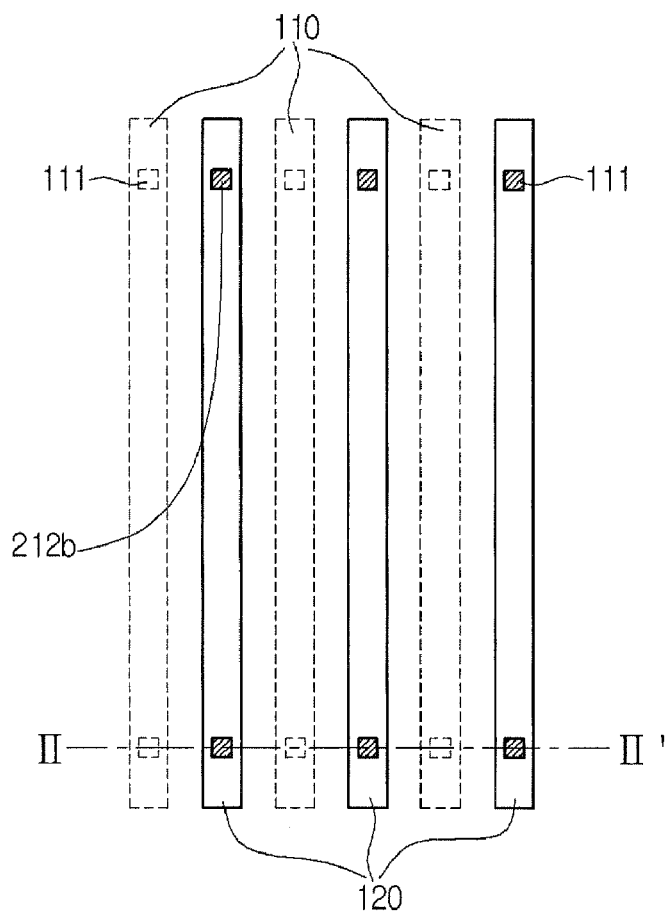
FIG. 3 is a plan view of a semiconductor device according to an embodiment.
Figure 4:
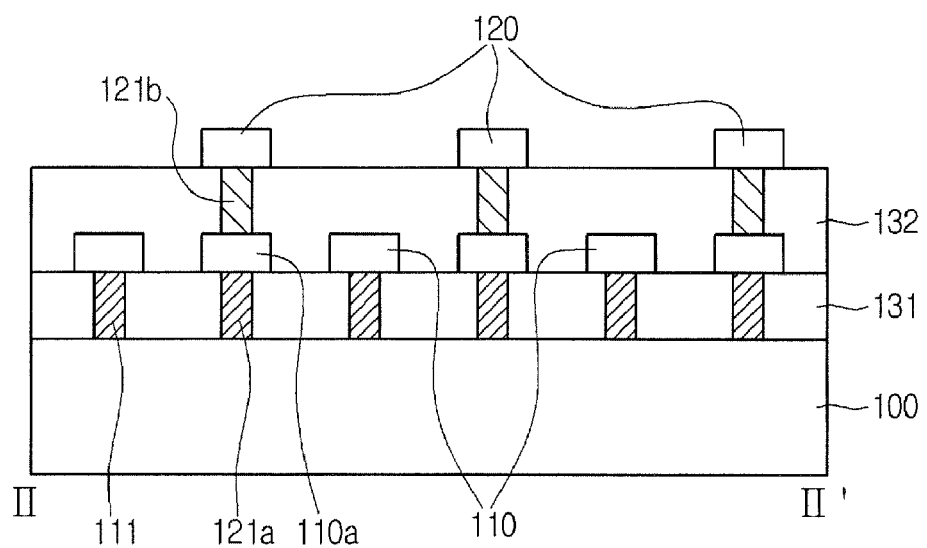
FIG. 4 is a cross-sectional view of the semiconductor device of FIG. 3 taken along line II-II'.

FIG. 3 is a plan view of a semiconductor device according to an embodiment, and FIG. 4 is a cross-sectional view of the semiconductor device of FIG. 3 taken along line II-II'.

Referring to FIGS. 3 and 4, a semiconductor device includes at least one bit line 110 and at least one bit bar line 120, in order to drive transistors (not shown).

The bit lines 110 and the bit bar lines 120 can be disposed in mutual alternation.

According to one embodiment, the bit lines 110 are formed on a first dielectric 131, and the bit bar lines 120 are formed on a second dielectric 132 above the first dielectric 131.

The bit lines 110 can be connected to the substrate 100 through a first contact pattern 111 formed in the first dielectric 131.

The bit bar lines 120 can be connected to the substrate 100 through a second contact pattern 121a formed in the first dielectric, a connecting pattern 110a stacked thereon, and a first bar pattern 121b stacked thereon.

The bit lines 110 and the bit bar lines 120 are formed on respectively different layers so that sufficient gaps are provided between the bit bar lines 120 formed on the second dielectric 132. By providing sufficient gaps between the bit bar lines 120, defect occurrence can be reduced even when there are particles in between.

Also, by forming the bit lines 110 and the bit bar lines 120 on different layers, there is no reduction in pitch from the degree of integration, thus allowing a less restrictive defect size.

Figure 5:
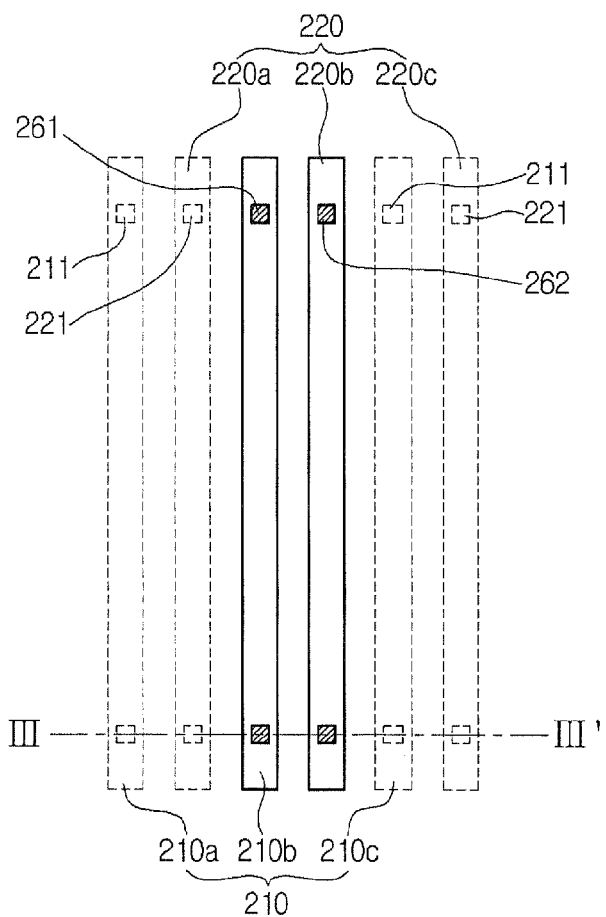
FIG. 5 is a plan view of a semiconductor device according to a second embodiment.
Figure 6:
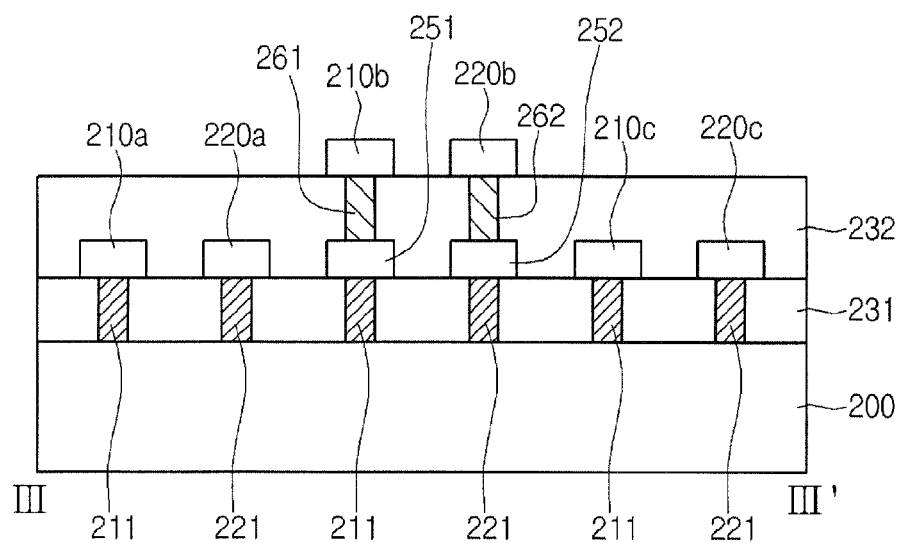
FIG. 6 is a cross-sectional view of the semiconductor device of FIG. 5 taken along line III-III'.

FIG. 5 is a plan view of a semiconductor device according to a second embodiment, and FIG. 6 is a cross-sectional view of the semiconductor device of FIG. 5 taken along line III-III'.

Referring to FIGS. 5 and 6, a semiconductor device includes at least one bit line 210 and at least one bit bar line 220 disposed at a predetermined gap, in order to drive transistors (not shown).

The bit lines 210 and the bit bar lines 220 can be disposed in mutual alternation.

For example, a first bit line 210a, a first bit bar line 220a, a second bit line 210b, a second bit bar line 220b, a third bit line 210c, and a third bit bar line 220c can be arranged in sequence.

The first bit line 210a and the first bit bar line 220a can be formed on a first dielectric 231, the second bit line 210b and the second bit bar line 220b can be formed on a second dielectric 232, and the third bit line 210c and the third bit bar line 220c can be formed on the first dielectric 231. The bit lines 210 and bit bar lines 220 can alternatingly be provided on the first dielectric 231 and the second dielectric 232 following this pattern.

The first and third bit lines 210a and 210c can be connected to the substrate 200 through first contact electrodes 211 formed in the first dielectric 231.

The first and third bit bar lines 220a and 220c can be connected to the substrate 200 through second contact electrodes 221 also formed in the first dielectric 231.

The second bit line 210b can be connected to the substrate 200 through the first contact electrode 211 formed in the first dielectric 231, the first connecting pattern 251 formed on the first contact electrode 211, and a first via pattern 261 formed in the second dielectric 232 and connected to the first connecting pattern 251.

The second bit bar line 220b can be connected to the substrate 200 through second contact electrode 221 formed in the first dielectric 231, a second connecting pattern 252 formed on the second contact electrode 221, and a second via contact 262 formed in the second dielectric 232 and connected to the second connecting pattern 252.

When the bit lines are paired with adjacent bit bar lines, the respective pairs are formed on different layers, so that there is a sufficient gap between two pairs formed on the second dielectric 232. Accordingly, defect occurrence can be reduced even when there are particles between the pairs.

Also, the bit lines and the bit bar lines are formed on respectively different layers, so that there is no reduction in pitch from the degree of integration, thus allowing a less restrictive defect size.

Figure 7:
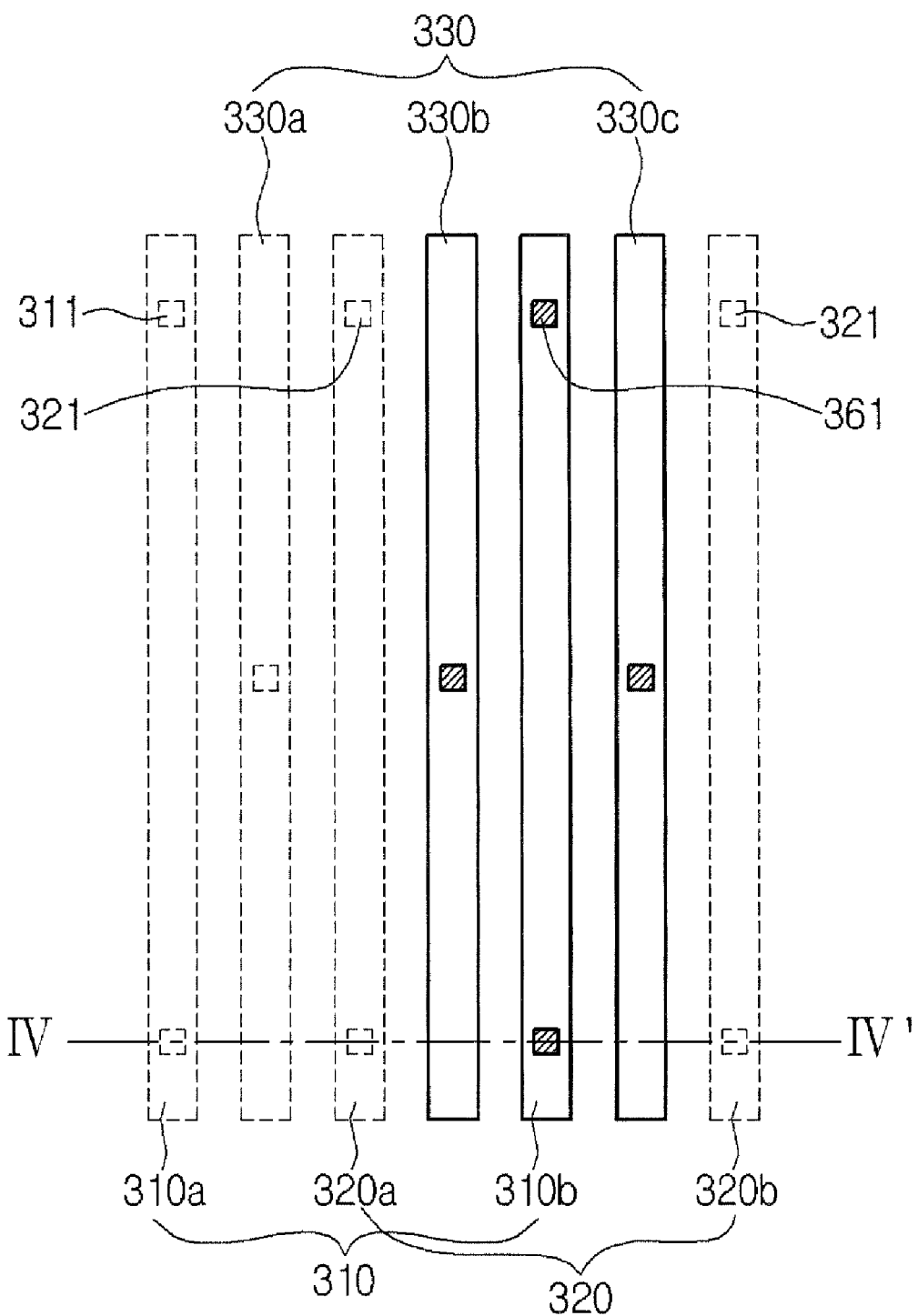
FIG. 7 is a plan view of a semiconductor device according to a third embodiment.
Figure 8:
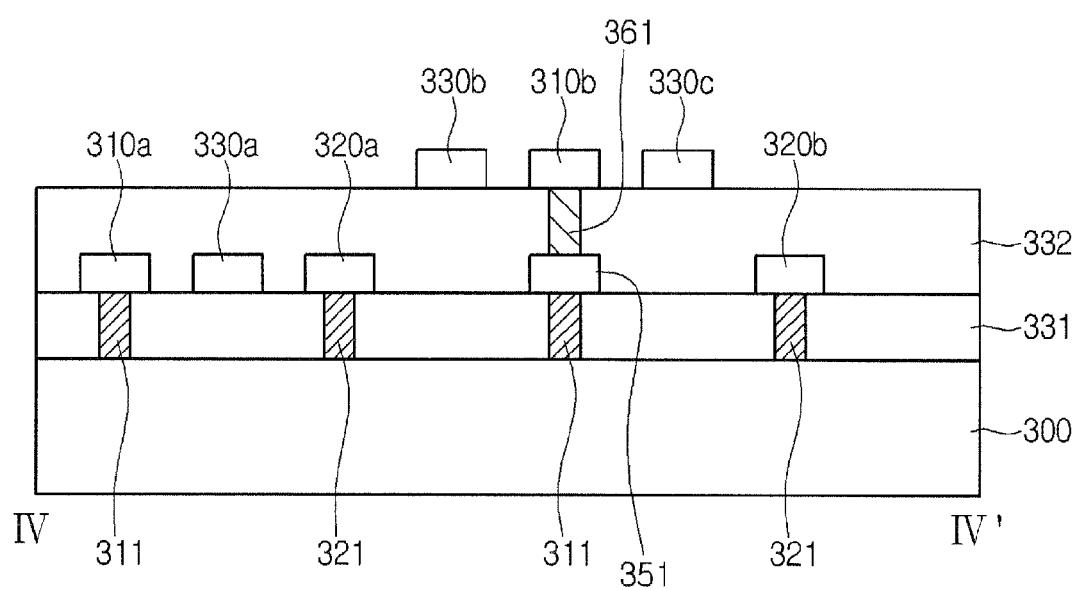
FIG. 8 is a cross-sectional view of the semiconductor device of FIG. 7 taken along line IV-IV'.

FIG. 7 is a plan view of a semiconductor device according to a third embodiment, and FIG. 8 is a cross-sectional view of the semiconductor device of FIG. 7 taken along line IV-IV'.

Referring to FIGS. 7 and 8, a semiconductor device can be provided with at least one bit line 310, at least one power line (including ground lines) 330 and at least one bit bar line 320 disposed at predetermined intervals, in order to drive transistors.

The bit lines 310 and the bit bar lines 320 can be disposed in mutual alternation, and the power lines 330 can be respectively disposed therebetween.

For example, a first bit line 310a, a first power line 330a, a first bit bar line 320a, a second power line 330b, a second bit line 310b, a third power line 330c, and a second bit bar line 320b can be sequentially arranged at predetermined intervals.

The first bit line 310a, the first power line 330a, the first bit bar line 320a, and the second bit bar line 320b can be formed on a first dielectric 331, and the second power line 330b, the second bit line 310b, and the third power line 330c can be formed on a second dielectric 332.

The first bit line 310a can be connected to the substrate 300 through first contact electrodes 311 formed in the first dielectric 331.

The first and second bit bar lines 320a and 320b can be connected to the substrate 300 through second contact electrodes 321 formed in the first dielectric 331.

The second bit line 310b can be connected to the substrate 300 through the first contact electrode 311 formed in the first dielectric 331, a first connecting pattern 351 formed on the first contact electrode 311, and a first via pattern 361 formed on the second dielectric 332 and connected to the first connecting pattern 351.

Figure 9:
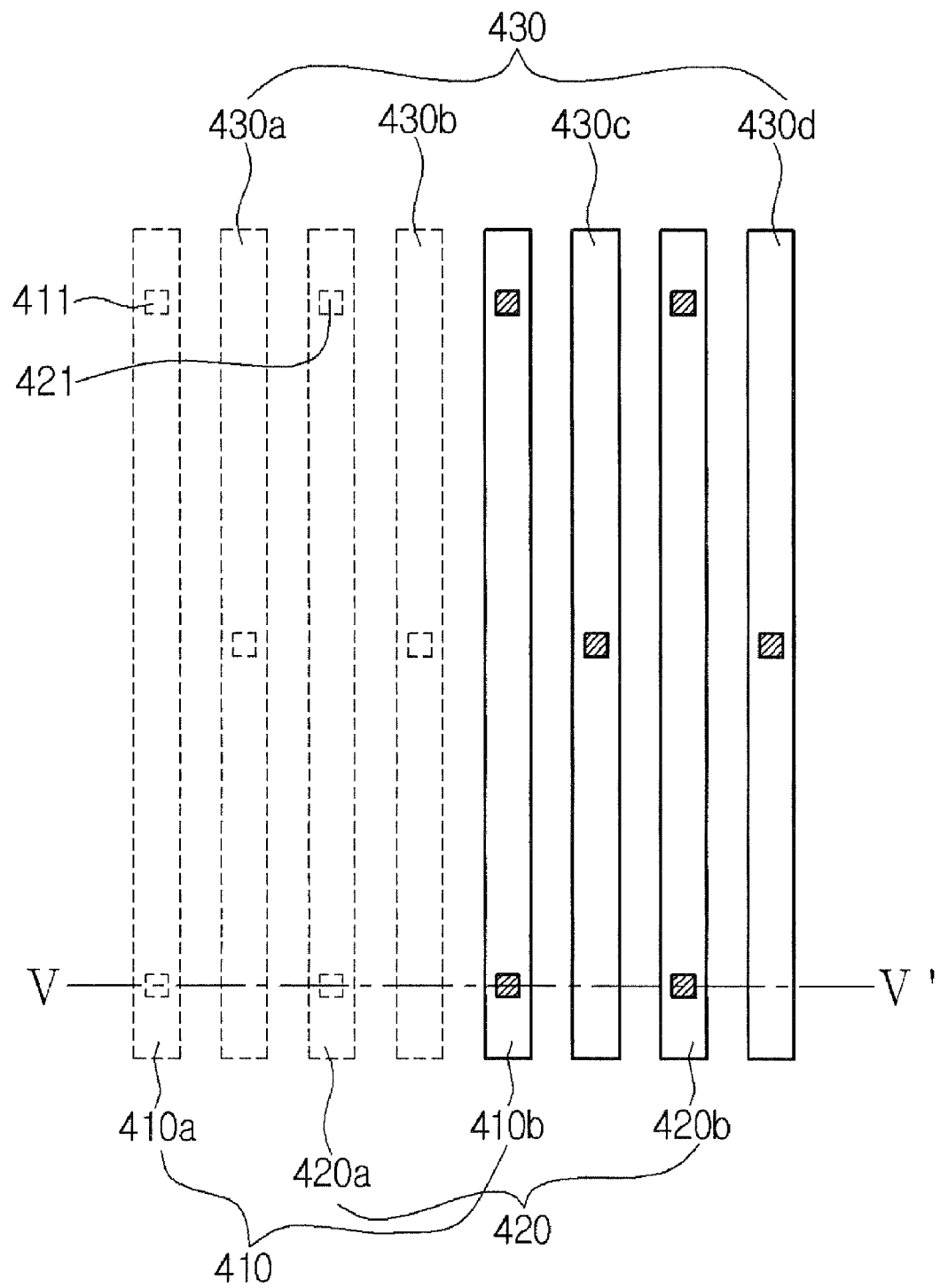
FIG. 9 is a plan view of a semiconductor device according to a fourth embodiment.
Figure 10:
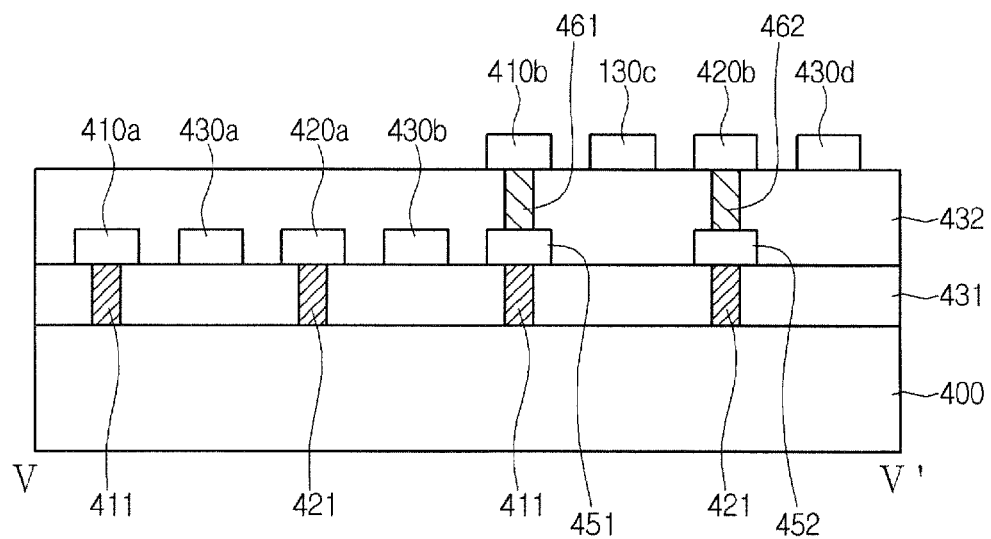
FIG. 10 is a cross-sectional view of the semiconductor device of FIG. 9 taken along line V-V'.

FIG. 9 is a plan view of a semiconductor device according to a fourth embodiment, and FIG. 10 is a cross-sectional view of the semiconductor device of FIG. 9 taken along line V-V'.

Referring to FIGS. 9 and 10, a semiconductor device can be provided with at least one bit line 410, at least one power line (including ground lines) 430, and at least one bit bar line 420 arranged at predetermined intervals, in order to drive transistors (not shown).

The bit lines 410 and the bit bar lines 420 can be disposed in mutual alternation.

The power lines 430 can be disposed between each of the bit lines 410 and the bit bar lines 420.

For example, a first bit line 410a, a first power line 430a, a first bit bar line 420a, a second power line 430b, a second bit line 410b, a third power line 430c, a second bit bar line 420b, and a fourth power line 430c can be sequentially arranged.

The first bit line 410a, the first power line 430a, the first bit bar line 420a, and the second power line 430b can be formed on a first dielectric 431, and the second bit line 410b, the third power line 430c, the second bit bar line 420b, and the fourth power line 430d can be formed on a second dielectric 432.

The first bit line 410a can be connected to the substrate 400 through a first contact electrode 411 formed in the first dielectric 431.

The first bit bar line 420a can be connected to the substrate 400 through a second contact electrode 421 formed in the first dielectric 431.

The second bit line 410b can be connected to the substrate 400 through the first contact electrode 411 formed in the first dielectric 431, a connecting pattern 451 formed on the first contact electrode 411, and a first via pattern 461 formed on the second dielectric 432 and connected to the first connecting pattern 451.

The second bit line 420b can be connected to the substrate 400 through a second contact electrode 421 formed in the first dielectric 431, a second connecting pattern 452 formed on the second contact electrode 421, and a second via pattern 462 formed in the second dielectric 432 and connected to the second connecting pattern 452.

When the bit lines are grouped with adjacent bit bar lines and the power lines (including ground lines) therebetween, the respective groups are formed on different layers, so that there is a sufficient gap between two groups formed on the second dielectric, thus reducing defect occurrence even when there are particles between the groups.

Also, the respective groups can be formed on respectively different layers, so that there is no reduction in pitch from the degree of integration, thus allowing a less restrictive defect size and lower defect sensitivity.

Figure 11:
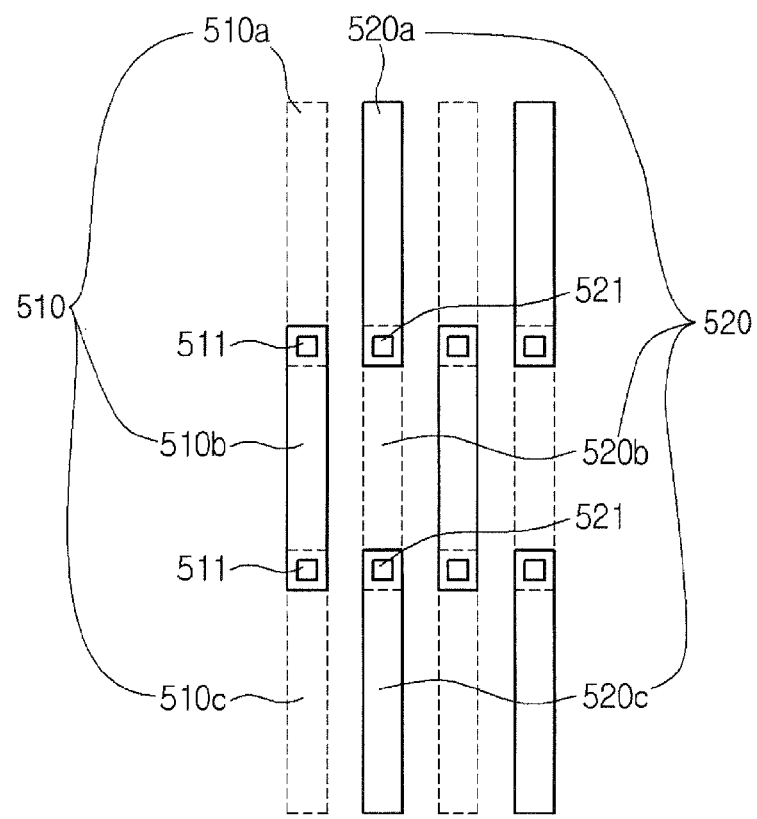
FIG. 11 is a plan view of a semiconductor device according to an embodiment.

FIG. 11 is a plan view of a semiconductor device according to another embodiment.

Referring to FIG. 11, a semiconductor device can be provided with at least one bit line 510 and at least one bit bar line 520, in order to drive transistors.

The bit lines 510 and the bit bar lines 520 can be arranged in mutual alternation.

The bit lines 510 can be formed of a first bit pattern 510a formed on a first dielectric, a second bit pattern 510b formed on a second dielectric and electrically connected to the first bit pattern 510a through a first via pattern 511, and a third bit pattern 510c formed on the first dielectric and electrically connected to the second bit pattern 510b through another first via pattern 511. Here, the bit lines 510 are each provided as connected bit patterns formed on respectively different layers.

The bit bar lines 520 are formed of a first bit bar pattern 520a formed on the second dielectric, a second bit bar pattern 520b formed on the first dielectric and electrically connected to the first bit bar pattern 520a through a second via pattern 521, and a third bit bar pattern 520c formed on the second dielectric and electrically connected to the second bit bar pattern 520b through another second via pattern 521. The first bit bar pattern 520a and the first bit pattern 510a are provided in mutually corresponding proximity, the second bit bar pattern 520b and the second bit pattern 510b are provided in mutually corresponding proximity, and the third bit bar pattern 520c and the third bit pattern 510c are provided in mutually corresponding proximity. Here, the bit bar lines 520 are formed staggered with the bit lines 510 on different layers.

That is, the first bit pattern 510a and the first bit bar pattern 520a are formed on respectively different dielectrics and the second bit pattern 510b and the second bit bar pattern 520b are formed on respectively different dielectrics. In addition, the first bit pattern 510a and the second bit pattern 510b are formed on respectively different dielectrics and the first bit bar pattern 520a and the second bit bar pattern 520b are formed on respectively different dielectrics.

When the bit lines 510 and the bit bar lines 520 are formed on respectively different layers, there is a sufficient gap between the bit bar lines 520 formed on the second dielectric, thus reducing defect occurrence even when there are particles between the bit bar lines.

When bit lines and bit bar lines are arranged, and power lines (including ground lines) are added within reduced chip areas in accordance with developments in semiconductor technology, the pitch between lines is reduced, raising defect sensitivity and compromising yield reliability. Thus, according to embodiments of the present invention, lines are arranged on mutually different layers, to lower defect sensitivity and increase yield. Also, in present embodiments, there is no need to provide a separate repair cell structure, which reduces costs and device size, producing the effect of being able to manufacture highly integrated chips.

While above descriptions have been given based on specific embodiments, they are only exemplary and are not limited thereto. It will thus be apparent to those having ordinary skill in the art that various other embodiments and applications not specifically described above and having the basic characteristics of the present disclosure will fall within the spirit and scope of the present invention. For example, each element specifically described in embodiments of the present invention may be alternately embodied. Also, the differences in such modifications and their uses shall be interpreted as falling within the spirit and scope of the present disclosure as disclosed in the claims below.

Any reference in this specification to "one embodiment," "first embodiment," "second embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    a first dielectric on a substrate;
    a first grouping of lines comprising bit lines on the first dielectric;
    a first connecting pattern between the hit lines on the first dielectric;
    a second dielectric on the first grouping of lines and the first connecting pattern;
    a first via pattern in the second dielectric and connected to the first connecting pattern; and
    a second grouping of lines comprising bit bar lines on the second dielectric,
    wherein the first via pattern is connected to each bit bar line of the second grouping of lines,
    wherein a bit line of the first grouping is in alternate succession with a bit bar line of the second grouping.

2. The semiconductor device according to claim 1, wherein the first grouping of lines comprises bit lines only, and the second grouping of lines comprises bit bar lines only.

3. The semiconductor device according to claim 2, further comprising a first contact pattern in the first dielectric connected to each bit line of the first grouping of lines.

4. The semiconductor device according to claim 2, further comprising a second contact pattern in the first dielectric and connected to the first connecting pattern.

* * * * *